United States Patent
Liu et al.

(10) Patent No.: US 10,109,653 B2
(45) Date of Patent: Oct. 23, 2018

(54) ARRAY SUBSTRATE, MANUFACTURING METHOD THEREOF AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Baoli Liu, Beijing (CN); Hao Chen, Beijing (CN); Haizheng Xie, Beijing (CN); Yu Lin, Beijing (CN); Xiaohui Zhu, Beijing (CN); Yuezheng Guan, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/568,155

(22) PCT Filed: May 12, 2017

(86) PCT No.: PCT/CN2017/084106
§ 371 (c)(1),
(2) Date: Oct. 20, 2017

(87) PCT Pub. No.: WO2018/000967
PCT Pub. Date: Jan. 4, 2018

(65) Prior Publication Data
US 2018/0219024 A1    Aug. 2, 2018

(30) Foreign Application Priority Data
Jun. 29, 2016    (CN) .......................... 2016 1 0499703

(51) Int. Cl.
*H01L 21/00* (2006.01)
*H01L 27/12* (2006.01)
(Continued)

(52) U.S. Cl.
CPC .......... *H01L 27/124* (2013.01); *G02F 1/1368* (2013.01); *G02F 1/134309* (2013.01);
(Continued)

(58) Field of Classification Search
CPC . H01L 27/124; G02F 1/1368; G02F 1/136227
See application file for complete search history.

(56) References Cited

U.S. PATENT DOCUMENTS 7,845,984 B2 * 12/2010 Schaffer ............... H01R 13/514
                                                         439/620.18
8,118,619 B2 *  2/2012 Schaffer ............... H01R 13/514
                                                         439/490
(Continued)

FOREIGN PATENT DOCUMENTS

CN    101087004 A    12/2007
CN    101989015 A     3/2011
(Continued)

OTHER PUBLICATIONS

International Search Report and Written Opinion dated Jul. 25, 2017; PCT/CN2017/084106.
(Continued)

*Primary Examiner* — Laura Menz
(74) *Attorney, Agent, or Firm* — Ladas & Parry LLP

(57) ABSTRACT

An array substrate, a manufacturing method thereof and a display device are provided. The array substrate includes: a base substrate; a thin-film transistor and a first conductive layer formed on the base substrate; and a passivation layer formed on the TFT and the first conductive layer. The TFT includes a source electrode and a drain electrode; the first
(Continued)

conductive layer is arranged in the same layer with the source electrode and the drain electrode; a second conductive layer is disposed on a side of the first conductive layer opposite to the passivation layer; the passivation layer is provided with a through hole penetrating therethrough; and an orthographic projection of the through hole on the base substrate falls within an orthographic projection of the first conductive layer on the base substrate and falls within an orthographic projection of the second conductive layer on the base substrate.

18 Claims, 3 Drawing Sheets

(51) Int. Cl.
    *G02F 1/1362*     (2006.01)
    *G02F 1/1343*     (2006.01)
    *G02F 1/1368*     (2006.01)

(52) U.S. Cl.
    CPC .. *G02F 1/136227* (2013.01); *G02F 1/136286* (2013.01); *G02F 2001/136295* (2013.01); *G02F 2201/121* (2013.01); *G02F 2201/123* (2013.01)

(56) References Cited

U.S. PATENT DOCUMENTS

| | | | | |
|---|---|---|---|---|
| 9,690,971 B2 * | 6/2017 | Liao | .................... | G06K 9/0004 |
| 9,753,339 B2 * | 9/2017 | Chen | .................. | G02F 1/13452 |
| 9,960,188 B2 * | 5/2018 | Zhang | ................. | H01L 27/1225 |
| 9,977,276 B2 * | 5/2018 | Peng | ................... | G02F 1/13338 |
| 9,991,295 B2 * | 6/2018 | Long et al. | ......... | H01L 27/1288 |
| 2006/0139548 A1 | 6/2006 | Ahn | | |
| 2012/0181557 A1 | 7/2012 | Kim et al. | | |
| 2013/0056726 A1 | 3/2013 | Chae et al. | | |
| 2016/0268320 A1 * | 9/2016 | Long | ..................... | H01L 27/124 |
| 2017/0148819 A1 * | 5/2017 | Lin | ....................... | H01L 27/124 |
| 2017/0188452 A1 * | 6/2017 | Chen | ................... | H05K 1/0215 |
| 2017/0336662 A1 * | 11/2017 | Zhang | ................... | G02F 1/1368 |
| 2018/0061994 A1 * | 3/2018 | Shi | .................... | H01L 29/78651 |
| 2018/0108773 A1 * | 4/2018 | Hao | ....................... | H01L 29/786 |

FOREIGN PATENT DOCUMENTS

| | | | | |
|---|---|---|---|---|
| CN | 102156368 A | | 8/2011 | |
| CN | 102403311 A | | 4/2012 | |
| CN | 102983152 A | | 3/2013 | |
| CN | 103021940 A | | 4/2013 | |
| CN | 104181740 A | * | 12/2014 | .......... G02F 1/1368 |
| CN | 104576657 A | | 4/2015 | |
| CN | 104867878 A | | 8/2015 | |
| CN | 105895639 A | | 8/2016 | |
| CN | 105977267 A | * | 9/2016 | |
| JP | 2008-103381 A | | 5/2008 | |
| WO | WO 2017202188 A1 | * | 11/2017 | ........... H01L 21/311 |
| WO | WO 2018000967 A1 | * | 1/2018 | ........... G02F 1/1362 |

OTHER PUBLICATIONS

The First Chinese Office Action dated May 30, 2018; Appln. No. 201610499703.2.

* cited by examiner

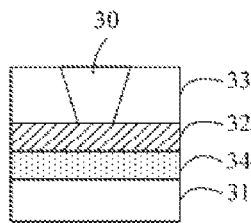
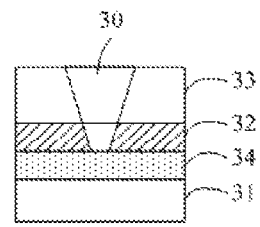
FIG. 4a                 FIG. 4b
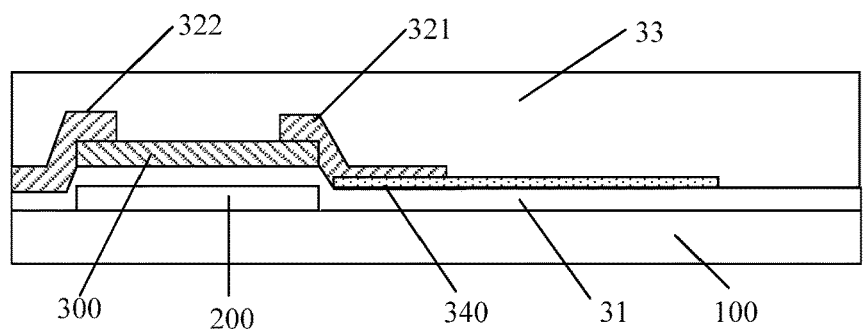
FIG. 5
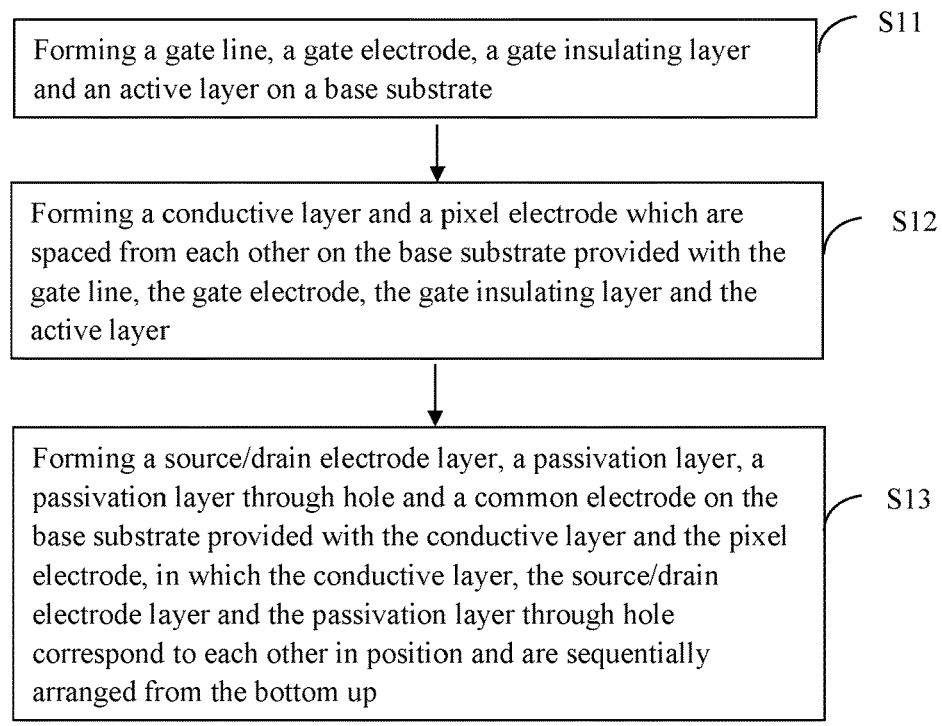
FIG. 6

ARRAY SUBSTRATE, MANUFACTURING METHOD THEREOF AND DISPLAY DEVICE

TECHNICAL FIELD

The present disclosure relates to an array substrate, a manufacturing method thereof and a display device.

BACKGROUND

With the development of thin-film transistor liquid crystal display (TFT-LCD) technology and the advance in industrial technology, the production cost of liquid crystal display (LCD) devices is reduced and the manufacturing process is gradually improved. TFT-LCDs have become the mainstream technology in the flat-panel display field instead of cathode ray tube (CRT) display, and have become ideal display devices in the market and the hearts of consumers due to the advantages of the TFT-LCDs.

SUMMARY

One embodiment of the disclosure provides an array substrate, comprising: a base substrate; a thin-film transistor (TFT) and a first conductive layer formed on the base substrate; and a passivation layer formed on the TFT and the first conductive layer, wherein the TFT includes a source electrode and a drain electrode; the first conductive layer is arranged in the same layer with the source electrode and the drain electrode; a second conductive layer is disposed on a side of the first conductive layer opposite to the passivation layer; the passivation layer is provided with a through hole penetrating therethrough; and an orthographic projection of the through hole on the base substrate falls within an orthographic projection of the first conductive layer on the base substrate and falls within an orthographic projection of the second conductive layer on the base substrate.

In some examples, the array substrate includes a display region and a peripheral region surrounding the display region; the TFT is disposed in the display region; and the first conductive layer and the second conductive layer are disposed in the peripheral region.

In some examples, the first conductive layer and the second conductive layer contact each other.

In some examples, the second conductive layer is made of a transparent conductive oxide.

In some examples, the conductive layer is a conductive layer subjected to annealing treatment.

In some examples, the display region further includes a pixel electrode which is connected to the drain electrode of the TFT, and the second conductive layer and the pixel electrode are separately arranged in the same layer and formed by one patterning process; or the display region further includes a common electrode, and the second conductive layer and the common electrode are separately arranged in the same layer and formed by one patterning process.

Another embodiment of the disclosure provides a method for manufacturing an array substrate, comprising: forming a source/drain electrode layer film on a base substrate, and patterning the source/drain electrode layer film to form a source electrode and a drain electrode of a TFT in a display region of the array substrate and form a first conductive layer in a peripheral region surrounding the display region of the array substrate; and forming a passivation layer on the source electrode and the drain electrode and the first conductive layer, and forming a through hole penetrating therethrough in the passivation layer, wherein before forming the first conductive layer, the method further comprises: forming a second conductive layer in the peripheral region; and an orthographic projection of the through hole on the base substrate falls within an orthographic projection of the first conductive layer on the base substrate and falls within an orthographic projection of the second conductive layer on the base substrate.

In some examples, the method further comprises: forming a pixel electrode in the display region, wherein the pixel electrode is connected with the drain electrode of the TFT; and the pixel electrode and the second conductive layer are formed by patterning a same conductive layer film.

In some examples, the method further comprises: forming a common electrode in the display region, wherein the common electrode and the second conductive layer are formed by patterning a same conductive layer film.

In some examples, forming the second conductive layer includes: forming a transparent conductive oxide film on the base substrate, and patterning the transparent conductive oxide film to form the second conductive layer.

In some examples, the method further comprises: performing annealing treatment on the second conductive layer.

In some examples, the first conductive layer and the second conductive layer make contact with each other.

Another embodiment provides a display device, comprising the array substrate according to any one of the above embodiments or examples.

The array substrate, the manufacturing method thereof and the display device, provided by the present disclosure, can avoid poor connection of structures on upper and lower layers of passivation layer through holes caused by the over-etching of the passivation layer through holes.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 1b is a sectional view along the AA line in FIG. 1a;

FIG. 4a is a schematic diagram of a passivation layer through hole in an ideal state in the embodiment of the present disclosure;

FIG. 4b is a schematic diagram of a passivation layer through hole in the embodiment of the present disclosure for completely etching the source/drain electrode layer;

FIG. 5 is a schematic partial sectional view of a display region of an array substrate provided by the embodiment of the present disclosure;

FIG. 6 is a schematic diagram of a method for manufacturing an array substrate, provided by the embodiment of the present disclosure.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

In the manufacturing process of a TFT substrate (array substrate), 6 mask process is used, namely the masks must be used for 6 times. The 6 mask processes are a Gate process (a gate layer, the $1^{st}$ mask process), an active process (an active layer, the $2^{nd}$ mask process), a first ITO process (first indium tin oxide (ITO) layer; may be taken as pixel electrodes or common electrodes; the $3^{rd}$ mask process), a SD process (source/drain electrode layer, the $4^{th}$ mask process), a VIA process (passivation layer through holes, including lead-in through holes for leading external signals into the source/drain electrode layer; when the first ITO layer is the common electrodes, further including through holes for connecting the drain electrodes of the TFTs and the pixel electrodes; the $5^{th}$ mask process), and a second ITO process (second ITO layer; may be taken as the common electrodes or the pixel electrodes; the $6^{th}$ mask process).

Figure 1A:
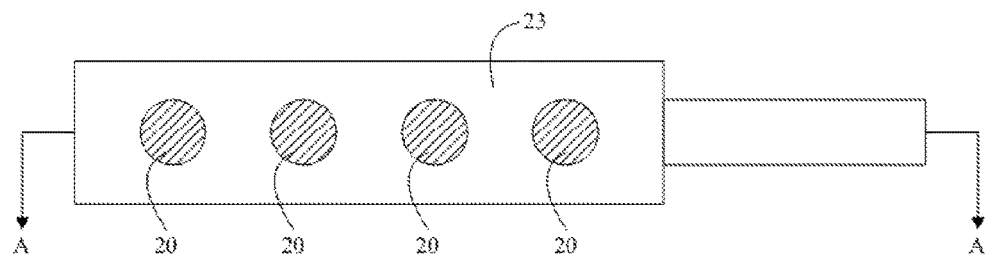
FIG. 1a is a schematic structural plan view of the periphery of passivation layer through holes in the prior art.
Figure 1B:
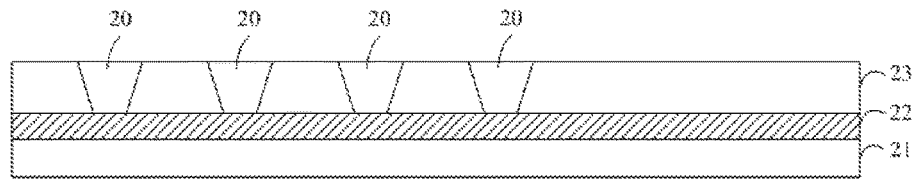
Figure 2A:
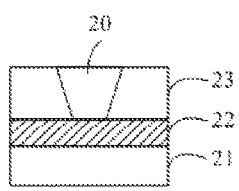
FIG. 2a is a schematic diagram of a passivation layer through hole in an ideal state in the prior art.
Figure 2B:
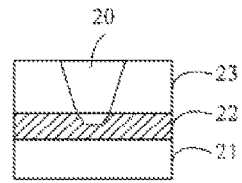
FIG. 2b is a schematic diagram of a passivation layer through hole in the prior art for etching one part of a source/drain electrode layer.
Figure 2C:
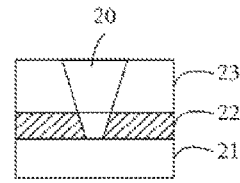
FIG. 2c is a schematic diagram of a passivation layer through hole in the prior art for completely etching the source/drain electrode layer.

In the $5^{th}$ mask process, dry etching is adopted to form the passivation layer through holes. The structures at the periphery of the passivation layer through holes 20 are as illustrated in FIGS. 1a and 1b and are respectively a passivation layer 23, a source/drain electrode layer 22 and a gate insulating layer 21 from the top down. The etching process of the passivation layer through holes generally have a certain over-etching rate on the premise of ensuring that the passivation layer is completely etched, so that the source/drain electrode layer 22 under the passivation layer 23 is etched. Therefore, as illustrated in FIG. 2a, in an ideal state, the depth of the passivation layer through hole 20 only reaches the source/drain electrode layer 22. But in the case of over-etching, the case as illustrated in FIG. 2b can be easily formed, so that one part of the source/drain electrode layer 22 is etched. In severe situation, the case as illustrated in FIG. 2c will also be formed, namely the source/drain electrode layer 22 is completely etched. Once the case as illustrated in FIG. 2c is formed, only source/drain electrode layer materials on side surfaces of the passivation layer through hole are connected with a structure on the passivation layer, e.g., the second ITO layer. In this case, the contact area of the structure on the passivation layer and the source/drain electrode layer is reduced, so the structure on the passivation layer cannot be lapped over the source/drain electrode layer, and hence circuit break may be caused.

Figure 3:
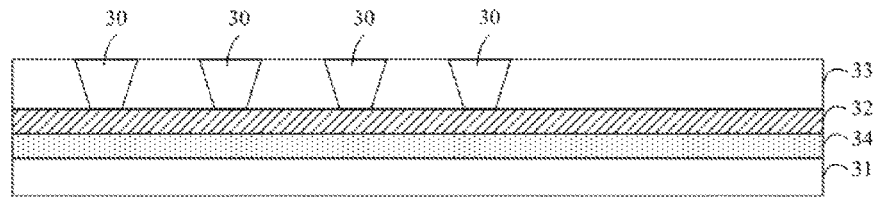
FIG. 3 is a sectional view of structures at the periphery of passivation layer through holes in the embodiment of the present disclosure.

The array substrate provided by the embodiment of the present disclosure comprises a base substrate; a gate line and a data line which are intersected with each other (for example, perpendicular to each other) are formed on the base substrate; a pixel region is defined by the gate line and the data line; a TFT and a pixel electrode are disposed in the pixel region; a gate electrode of the TFT is connected with the gate line; a source electrode is connected with the data line; and a drain electrode is connected with the pixel electrode. As illustrated in FIG. 3, in the array substrate provided by the embodiment, a conductive layer 34 is disposed under a source/drain electrode layer 32 provided with the source/drain electrodes; a passivation layer through hole 30 is formed on the source/drain electrode layer; and the conductive layer 34, the source/drain electrode layer 32 and the passivation layer through hole 30 correspond to each other in position and are sequentially arranged from the bottom up.

For example, the array substrate comprises a display region and a peripheral region surrounding the display region. For example, the TFT, the pixel electrode, the gate electrode, the gate line, the data line and the like are all disposed in the display region. A part provided with the passivation layer through hole is disposed in the peripheral region. For the convenience of description, a part of the source/drain electrode layer 32 disposed in the peripheral region is referred to as a first conductive layer, and a conductive layer 34 under the source/drain electrode layer 32 is referred to as a second conductive layer.

For example, an orthographic projection of the passivation layer through hole on the base substrate falls within an orthographic projection of the first conductive layer on the base substrate and falls within an orthographic projection of the second conductive layer on the base substrate. Thus, if the first conductive layer (source/drain electrode layer) is over-etched in the process of forming the passivation layer through holes, the etching process at least can stop at a position of the second conductive layer, so as to avoid the two conductive layers from being completely etched.

For example, the first conductive layer and the second conductive layer make contact with each other.

The passivation layer through hole 30 is disposed in a passivation layer 33; the source electrode is disposed in the source/drain electrode layer 32; the conductive layer 34 is disposed under the source/drain electrode layer 32; and a gate insulating layer 31 is disposed under the conductive layer 34.

In the embodiment, after the conductive layer 34 is additionally arranged under the source/drain electrode layer 32, the source/drain electrode layer 32 is electrically connected with the conductive layer 34. Thus, in the process of etching the passivation layer through hole 30, even the source/drain electrode layer 32 is completely etched due to over-etching, the conductive layer 34 can still be connected in large area with the structure formed in the subsequent process via the passivation layer through hole 30, so as to eliminate the hidden risk of the over-etching of the passivation layer through hole and avoid poor connection of structures on upper and lower layers of the passivation layer through hole 30 due to the over-etching of the passivation layer through hole. As illustrated in FIG. 4a, in an ideal state, the position of the passivation layer through hole 30 only reaches the source/drain electrode layer 32. But even as illustrated in FIG. 4b, when the source/drain electrode layer 32 is completely etched, the conductive layer 34 can also be connected with the structure on the passivation layer 33.

Although not illustrated in FIG. 3, in one embodiment of the array substrate, a pixel electrodes can also be disposed under the source/drain electrode layer 32. At this point, the conductive layer 34 and the pixel electrode are separately arranged in the same layer and formed by one patterning process.

In the 6 mask process structure of the array substrate, the pixel electrode and the source/drain electrodes may be formed in sequence after forming the active layer, and subsequently the passivation layer and the common electrode are formed, and at this point, the pixel electrode is directly lapped over the drain electrode of the TFT, and the function of the passivation layer through hole is to lead external signals into the drain electrode; or the common electrode and the source/drain electrodes may also be formed in sequence after forming the active layers, and subsequently, the passivation layer and the pixel electrode are formed, and at this point, the passivation layer through hole also has the function of connecting the pixel electrode and the drain electrode.

When the pixel electrode is formed at first and then the common electrode is formed, the conductive layer 34 and the pixel electrode may be separately arranged in the same layer and formed by one patterning process, so the conductive layer 34 and the pixel electrode can be simultaneously formed by only one mask process (mask exposure and development processes). Thus, the mask for forming the pixel electrode originally is improved by only one patterning process, so that the mask can simultaneously include patterns for forming the conductive layer 34, but the frequency for using the mask is not increased, so the cost can be effectively controlled.

Similarly, although not illustrated in FIG. 3, in another preferred embodiment of the array substrate, the common electrode is also disposed under the source/drain electrode layer 32, and the conductive layer and the common electrode are separately arranged in the same layer and formed by one patterning process. When the common electrode is formed at first and then the pixel electrode is formed, the conductive layer 34 and the common electrode may be separately arranged in the same layer and formed by one patterning process, so that the conductive layer 34 and the common electrode can be simultaneously formed by only one mask process. Only the mask for forming the common electrode originally is improved so that the mask can simultaneously include patterns for forming the conductive layer 34, and the frequency for using the mask is not increased, so the cost can be effectively controlled.

It should be noted that FIGS. 1a to 4b are schematic structural partial view of the peripheral region of the array substrate, and only show partial relevant layers, for example, the passivation layer, the first conductive layer, the second conductive layer and the gate insulating layer. FIG. 5 is a schematic partial sectional view of the display region of the array substrate provided by the embodiment of the present disclosure. As illustrated in FIG. 5, a gate electrode 200, a gate insulating layer 310, an active layer 300, a pixel electrode 340, a source electrode 322 and a drain electrode 321 are arranged on a base substrate 100 in sequence. For example, in the embodiment, the pixel electrode 340 and the second conductive layer 34 are arranged in the same layer (for example, formed by patterning the same conductive film), and the pixel electrode 340 is connected to the drain electrode 321. The source electrode 322 and the drain electrode 321 are arranged in the same layer with the first conductive layer 32 (for example, formed by pattering the same conductive film).

When the common electrode layer and the second conductive layer are arranged in the same layer, the display region also has the structures as similar to FIG. 5, and the only difference is that the common electrodes will not be connected to the drain electrode 321.

In the above embodiments, the conductive layer 34 is a conductive layer subjected to annealing treatment. When the conductive layer 34 and the pixel electrode or the common electrode are formed by the same patterning process, as the pixel electrode or the common electrode are usually made of ITO materials, the conductive layer 34 may also be made of ITO materials. After the conductive layer is subjected to annealing treatment, the ITO materials may have the characteristic that the ITO materials can hardly be etched. Therefore, even the source/drain electrode layer 32 is completely etched due to over-etching, the conductive layer 34 will not be completely etched, so as to avoid the hidden risk that the source/drain electrode layer 32 cannot be lapped over the structure formed in the subsequent process. It should be noted that the materials in the embodiment of the present disclosure are not limited to the ITO materials and may also be other transparent conductive oxide materials.

Apart from the array substrate, the embodiment of the present disclosure further provides two methods for manufacturing the array substrate. The difference between the two manufacturing processes is different forming sequences of the pixel electrode and the common electrode. In the following first embodiment of the manufacturing method, the pixel electrode is formed at first and then the common electrode is formed. In the following second embodiment of the manufacturing method, the common electrode is formed at first and then the pixel electrode is formed.

First Embodiment of Manufacturing Method

In the first embodiment, as illustrated in FIG. 6, the manufacturing method of the array substrate comprises:

S11: forming a gate line, a gate electrode, a gate insulating layer and an active layer on a base substrate;

S12: forming a conductive layer and a pixel electrode which are spaced from each other on the base substrate provided with the gate line, the gate electrode, the gate insulating layer and the active layer; and S13: forming a source/drain electrode layer, a passivation layer, a passivation layer through hole and a common electrode on the base substrate provided with the conductive layer and the pixel electrode, in which the conductive layer, the source/drain electrode layer and the passivation layer through hole correspond to each other in position and are sequentially arranged from the bottom up.

The manufacturing steps S11 and S13 in the first embodiment can adopt the conventional manufacturing steps. The difference is that in the step S12, the conductive layer and the pixel electrode are formed by one patterning process and arranged in the same layer.

Moreover, between the steps S12 and S13, the method further comprises: performing annealing treatment on the conductive layer.

Second Embodiment of Manufacturing Method

Figure 7:
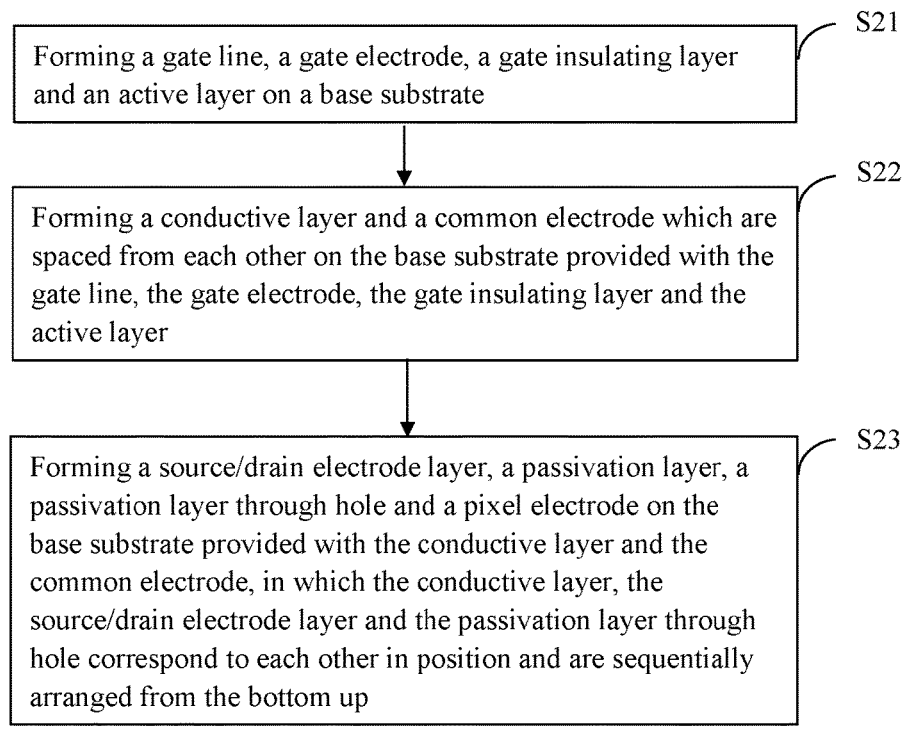
FIG. 7 is a schematic diagram of another method for manufacturing an array substrate, provided by the embodiment of the present disclosure.

In the second embodiment, as illustrated in FIG. 7, the manufacturing method of the array substrate comprises:

S21: forming a gate line, a gate electrode, a gate insulating layer and an active layer on a base substrate;

S22: forming a conductive layer and a common electrode which are spaced from each other on the base substrate provided with the gate line, the gate electrode, the gate insulating layer and the active layer; and S23: forming a source/drain electrode layer, a passivation layer, a passivation layer through hole and a pixel electrode on the base substrate provided with the conductive layer and the common electrode, in which the conductive layer, the source/drain electrode layer and the passivation layer through hole correspond to each other in position and are sequentially arranged from the bottom up.

The steps S21 and S23 in the second embodiment may adopt the conventional manufacturing steps. The difference is that in the step S22, the conductive layer and the common electrode are formed by one patterning process and arranged in the same layer.

Between the steps S22 and S23, the method further comprises: performing annealing treatment on the conductive layer.

Based on the embodiment of the array substrate, the embodiment of the present disclosure further provides a display device, which comprises the array substrate provided by the embodiment.

In the description of the embodiments, the specific characteristics, structures, materials or features may be combined in any form in one or a plurality of embodiments or examples.

The foregoing is only the preferred embodiments of the present disclosure and not intended to limit the scope of protection of the present disclosure. The scope of protection of the present disclosure should be defined by the appended claims.

The application claims priority to the Chinese patent application No. 201610499703.2, filed Jun. 29, 2016, the disclosure of which is incorporated herein by reference as part of the application.

The invention claimed is:

1. An array substrate, comprising:
a base substrate;
a thin-film transistor (TFT) and a first conductive layer formed on the base substrate; and
a passivation layer formed on the TFT and the first conductive layer, wherein
the TFT includes a source electrode and a drain electrode; the first conductive layer is arranged in the same layer with the source electrode and the drain electrode; a second conductive layer is disposed on a side of the first conductive layer opposite to the passivation layer; the passivation layer is provided with a through hole penetrating therethrough; and an orthographic projection of the through hole on the base substrate falls within an orthographic projection of the first conductive layer on the base substrate and falls within an orthographic projection of the second conductive layer on the base substrate.

2. The array substrate according to claim 1, wherein the array substrate includes a display region and a peripheral region surrounding the display region; the TFT is disposed in the display region; and the first conductive layer and the second conductive layer are disposed in the peripheral region.

3. The array substrate according to claim 1, wherein the first conductive layer and the second conductive layer contact each other.

4. The array substrate according to claim 1, wherein the second conductive layer is made of a transparent conductive oxide.

5. The array substrate according to claim 1, wherein the second conductive layer is a conductive layer subjected to annealing treatment.

6. The array substrate according to claim 1, wherein the display region further includes a pixel electrode which is connected to the drain electrode of the TFT, and the second conductive layer and the pixel electrode are separately arranged in the same layer and formed by one patterning process; or
the display region further includes a common electrode, and the second conductive layer and the common electrode are separately arranged in the same layer and formed by one patterning process.

7. A method for manufacturing an array substrate, comprising:
forming a source/drain electrode layer film on a base substrate, and patterning the source/drain electrode layer film to form a source electrode and a drain electrode of a TFT in a display region of the array substrate and form a first conductive layer in a peripheral region surrounding the display region of the array substrate; and
forming a passivation layer on the source electrode and the drain electrode and the first conductive layer, and forming a through hole penetrating therethrough in the passivation layer, wherein
before forming the first conductive layer, the method further comprises: forming a second conductive layer in the peripheral region; and an orthographic projection of the through hole on the base substrate falls within an orthographic projection of the first conductive layer on the base substrate and falls within an orthographic projection of the second conductive layer on the base substrate.

8. The method for manufacturing the array substrate according to claim 7, further comprising: forming a pixel electrode in the display region, wherein the pixel electrode is connected with the drain electrode of the TFT; and the pixel electrode and the second conductive layer are formed by patterning a same conductive layer film.

9. The method for manufacturing the array substrate according to claim 7, further comprising: forming a common electrode in the display region, wherein the common electrode and the second conductive layer are formed by patterning a same conductive layer film.

10. The method for manufacturing the array substrate according to claim 7, wherein forming the second conductive layer includes: forming a transparent conductive oxide film on the base substrate, and patterning the transparent conductive oxide film to form the second conductive layer.

11. The method for manufacturing the array substrate according to claim 10, further comprising: performing annealing treatment on the second conductive layer.

12. The method for manufacturing the array substrate according to claim 7, wherein the first conductive layer and the second conductive layer make contact with each other.

13. A display device, comprising the array substrate according to claim 1.

14. The display device according to claim 13, wherein the array substrate includes a display region and a peripheral region surrounding the display region; the TFT is disposed in the display region; and the first conductive layer and the second conductive layer are disposed in the peripheral region.

15. The display device according to claim 13, wherein the first conductive layer and the second conductive layer contact each other.

16. The display device according to claim 13, wherein the second conductive layer is made of a transparent conductive oxide.

17. The display device according to claim 13, wherein the conductive layer is a conductive layer subjected to annealing treatment.

18. The display device according to claim 13, wherein
the display region further includes a pixel electrode which is connected to the drain electrode of the TFT, and the second conductive layer and the pixel electrode are separately arranged in the same layer and formed by one patterning process; or the display region further includes a common electrode, and the second conductive layer and the common electrode are separately arranged in the same layer and formed by one patterning process.

\* \* \* \* \*